United States Patent

Hayashi (10) Patent No.: US 10,074,552 B2
(45) Date of Patent: Sep. 11, 2018

(54) METHOD OF MANUFACTURING ELECTROSTATIC CHUCK HAVING DOT STRUCTURE ON SURFACE THEREOF

(71) Applicant: TOKYO ELECTRON LIMITED, Tokyo (JP)

(72) Inventor: Daisuke Hayashi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 655 days.

(21) Appl. No.: 14/630,730

(22) Filed: Feb. 25, 2015

(65) Prior Publication Data

US 2015/0243541 A1 Aug. 27, 2015

(30) Foreign Application Priority Data

Feb. 26, 2014 (JP) ................. 2014-035162

(51) Int. Cl.
*C23C 16/40* (2006.01)
*H01L 21/683* (2006.01)
(Continued)

(52) U.S. Cl.
CPC .... *H01L 21/6831* (2013.01); *H01J 37/32715* (2013.01); *H01L 21/6833* (2013.01); *H01L 21/6875* (2013.01); *H01J 37/32091* (2013.01)

(58) Field of Classification Search
CPC ... C23C 16/40; C23C 16/405; H01L 21/6831; H01L 21/6875
See application file for complete search history.

(56) References Cited

U.S. PATENT DOCUMENTS

2005/0024809 A1* 2/2005 Kuchimachi ....... H01L 21/6833
361/234
2007/0042897 A1* 2/2007 Aihara ................. C04B 35/505
501/152
(Continued)

FOREIGN PATENT DOCUMENTS

EP         2030961 A2 *  3/2009
JP      2002-334920 A    11/2002
(Continued)

OTHER PUBLICATIONS

Kitamura, J., et al., "Crystal and micro structures of plasma sprayed yttrium oxide coatings by axial injection of fine powder slurries." Fujimi Incorporated, Manuscipt for ITSC2010, 2010, pp. 1-6.*
(Continued)

*Primary Examiner* — Bret P Chen
(74) *Attorney, Agent, or Firm* — Rothwell, Figg, Ernst & Manbeck, P.C.

(57) ABSTRACT

A method of manufacturing an electrostatic chuck includes providing a dielectric substrate having a surface which is constituted by a bottom face, and a plurality of projecting portions protruding from the bottom face, the plurality of projecting portions including top faces to come in contact with the processing target object, and side faces extending from the bottom face to the top faces, respectively; and forming a protective film made of yttrium oxide on the side faces of the plurality of projecting portions and the bottom face such that the top faces are exposed.

7 Claims, 8 Drawing Sheets

(51) Int. Cl.
*H01J 37/32* (2006.01)
*H01L 21/687* (2006.01)

(56) References Cited

U.S. PATENT DOCUMENTS

| | | | | |
|---|---|---|---|---|
| 2008/0047952 | A1* | 2/2008 | Mori | C04B 35/111 |
| | | | | 219/469 |
| 2009/0243235 | A1* | 10/2009 | Nobori | H01L 21/6831 |
| | | | | 279/128 |
| 2010/0067165 | A1* | 3/2010 | Ando | H02N 13/00 |
| | | | | 361/234 |
| 2013/0201598 | A1* | 8/2013 | Ishikawa | B23Q 3/152 |
| | | | | 361/234 |
| 2014/0034059 | A1* | 2/2014 | Yagi | A62B 23/025 |
| | | | | 128/207.11 |
| 2014/0177123 | A1* | 6/2014 | Thach | H01L 21/67103 |
| | | | | 361/234 |

FOREIGN PATENT DOCUMENTS

| | | | |
|---|---|---|---|
| JP | 2005-19700 | A | 1/2005 |
| JP | 2007-173596 | A | 7/2007 |
| JP | 2008-16709 | * | 1/2008 |
| JP | 2008-160093 | A | 7/2008 |
| JP | 2008-300374 | A | 12/2008 |
| TW | 201240011 | A1 | 10/2012 |
| WO | 2013/111363 | A1 | 8/2013 |

OTHER PUBLICATIONS

Kitamura, Junya, et al., "Plasma-Erosion Properties of Ceramic Coating Prepared by Plasma Spraying". Materials Transactions, vol. 47, No. 7, (2006) pp. 1677-1683.*

* cited by examiner

METHOD OF MANUFACTURING ELECTROSTATIC CHUCK HAVING DOT STRUCTURE ON SURFACE THEREOF

CROSS-REFERENCE TO RELATED APPLICATIONS

This application is based on and claims priority from Japanese Patent Application No. 2014-035162, filed on Feb. 26, 2014, with the Japan Patent Office, the disclosure of which is incorporated herein in its entirety by reference.

TECHNICAL FIELD

The present disclosure relates to an electrostatic chuck, a placing table, a plasma processing apparatus, and a method of manufacturing the electrostatic chuck.

BACKGROUND

In manufacturing an electronic device such as, for example, a semiconductor device, a plasma processing may be performed on an object to be processed ("processing target object"). In the plasma processing, a plasma processing apparatus is used. The plasma processing apparatus generally includes a placing table within a processing container. The placing table is configured to place a processing target object thereon. The placing table may include an electrostatic chuck configured to attract the processing target object by an electrostatic force.

The electrostatic chuck may have a dot structure on the surface thereof. That is, this type of electrostatic chuck has a surface constituted by a bottom face, and a plurality of projecting portions protruding from the bottom face. Such a dot structure is formed by, for example, a blast treatment. Accordingly, the side face of the dot structure and the bottom face around the side face may become fractured surfaces from which particles are likely to occur, thereby generating particles.

There is known a method of forming a surface of an electrostatic chuck by using a polycrystalline substance of, for example, yttrium oxide (hereinafter, also referred to as yttria ($Y_2O_3$)) which is excellent in a plasma resistance in order to suppress, for example, particles from occurring due to such a dot structure (See, e.g., Japanese Patent Laid-Open Publication Nos. 2008-160093 and 2007-173596).

SUMMARY

The present disclosure provides an electrostatic chuck configured to hold a processing target object. The electrostatic chuck includes: a dielectric substrate having a surface which is constituted by a bottom face and a plurality of projecting portions protruding from the bottom face, the plurality of projecting portions including top faces to come in contact with the processing target object, and side faces extending from the bottom face to the top faces, respectively; and a protective film made of yttrium oxide, which is formed on the side faces of the plurality of projecting portions and the bottom face such that the top faces are exposed.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

As described above, yttria is excellent in a plasma resistance. However, yttria has a large change rate of electrical resistance with respect to temperature. Accordingly, when the surface of the electrostatic chuck is made of yttria, an attraction force of the electrostatic chuck is changed according to a temperature change. Therefore, in the electrostatic chuck having a surface made of yttria, the attraction force may be varied during a plasma processing.

When a processing target object is processed by plasma of a fluorine-containing gas, yttrium fluoride is formed by a reaction between yttria contained in the surface of the electrostatic chuck and active species of fluorine. According to the formation of yttrium fluoride, the attraction force of the electrostatic chuck may be changed with elapse of time.

Accordingly, it is required to suppress occurrence of particles from the electrostatic chuck, and also to suppress variation of attraction force of the electrostatic chuck on the processing target object.

In an aspect, there is provided an electrostatic chuck configured to hold a processing target object. The electrostatic chuck includes a dielectric substrate and a protective film. The substrate has a surface which is constituted by a bottom face, and a plurality of projecting portions. The plurality of projecting portions is formed to protrude from the bottom face. Each of the projecting portions includes a top face, and a side face. The top face comes in contact with the processing target object, and the side face extends from the bottom face to the top face. The protective film is made of yttrium oxide. The protective film is formed on the side faces of the plurality of projecting portions and the bottom face such that the top faces are exposed.

In the electrostatic chuck, since the bottom face and the side faces of the plurality of projecting portions, which constitute the surface of the electrostatic chuck, are covered with the protective film made of yttria, particles are suppressed from occurring. Also, since the protective film is not formed on the top faces of the projecting portions which are mainly in charge of attraction of the processing target object, it is possible to suppress an attraction force from being varied according to a temperature change, or from being changed according to formation of yttrium fluoride.

In an exemplary embodiment, the electrostatic chuck may further include an electrode provided within the substrate. In an exemplary embodiment, the substrate may include aluminum oxide or aluminum nitride.

In an exemplary embodiment, the protective film may have a film thickness ranging from 0.5 µm to 10 µm. The protective film having such a film thickness may be formed by, for example, a CVD method, and particles may be further suppressed from occurring.

In an exemplary embodiment, a ratio of an area occupied by the top faces of the plurality of projecting portions in a total area of the bottom face and the top faces of the plurality of projecting portions ranges from, for example, 5% to 40%. According to this embodiment, occurrence of particles may be further suppressed.

In another aspect, there is provided a placing table. The placing table includes a base portion, and any one of various types of electrostatic chucks according to the aspect.

In a further aspect, there is provided an apparatus for performing a plasma processing on a processing target object. The apparatus includes: a processing container; and the placing table. In an exemplary embodiment, the plasma processing apparatus may further include a DC power supply electrically connected to the electrode included in the electrostatic chuck of the placing table.

In a still further aspect, there is provided a method of manufacturing an electrostatic chuck. The method includes: (a) providing a dielectric substrate having a surface which is constituted by a bottom face, and a plurality of projecting portions protruding from the bottom face, the plurality of projecting portions including top faces to come in contact with the processing target object, and side faces extending from the bottom face to the top faces, respectively; and (b) forming a protective film made of yttrium oxide on the side faces of the plurality of projecting portions and the bottom face such that the top faces are exposed. According to the method, the above described electrostatic chuck is manufactured.

The preparing (a) of the substrate further includes: (a1) providing a first unsintered dielectric layer; (a2) disposing a conductive paste on a main surface of the first unsintered dielectric layer; (a3) forming a second unsintered dielectric layer on the conductive paste and the first unsintered dielectric layer; (a4) sintering the first unsintered dielectric layer, the second unsintered dielectric layer, and the conductive paste to prepare a sintered body; and (a5) forming the bottom face and the plurality of projecting portions on the sintered body.

In the method according to an exemplary embodiment, the substrate may include aluminum oxide or aluminum nitride. Also, in an exemplary embodiment, a ratio of an area occupied by the top faces of the plurality of projecting portions in a total area of the bottom face and the top faces of the plurality of projecting portions may range from, for example, 5% to 40%.

In the method according to an exemplary embodiment, the protective film may be formed by a CVD method, an aerosol method or an ion plating method. According to this embodiment, a protective film having a dense film quality is formed, and thus, particles are further suppressed from occurring from the protective film.

As described above, it is possible to suppress occurrence of particles from the electrostatic chuck, and also to suppress variation of attraction force of the electrostatic chuck on the processing target object.

Hereinafter, exemplary embodiments of the present disclosure will be described in detail with reference to the accompanying drawings. In the following description, same elements or elements having the same function are given the same reference numerals, and redundant descriptions thereof will be omitted.

Figure 1:
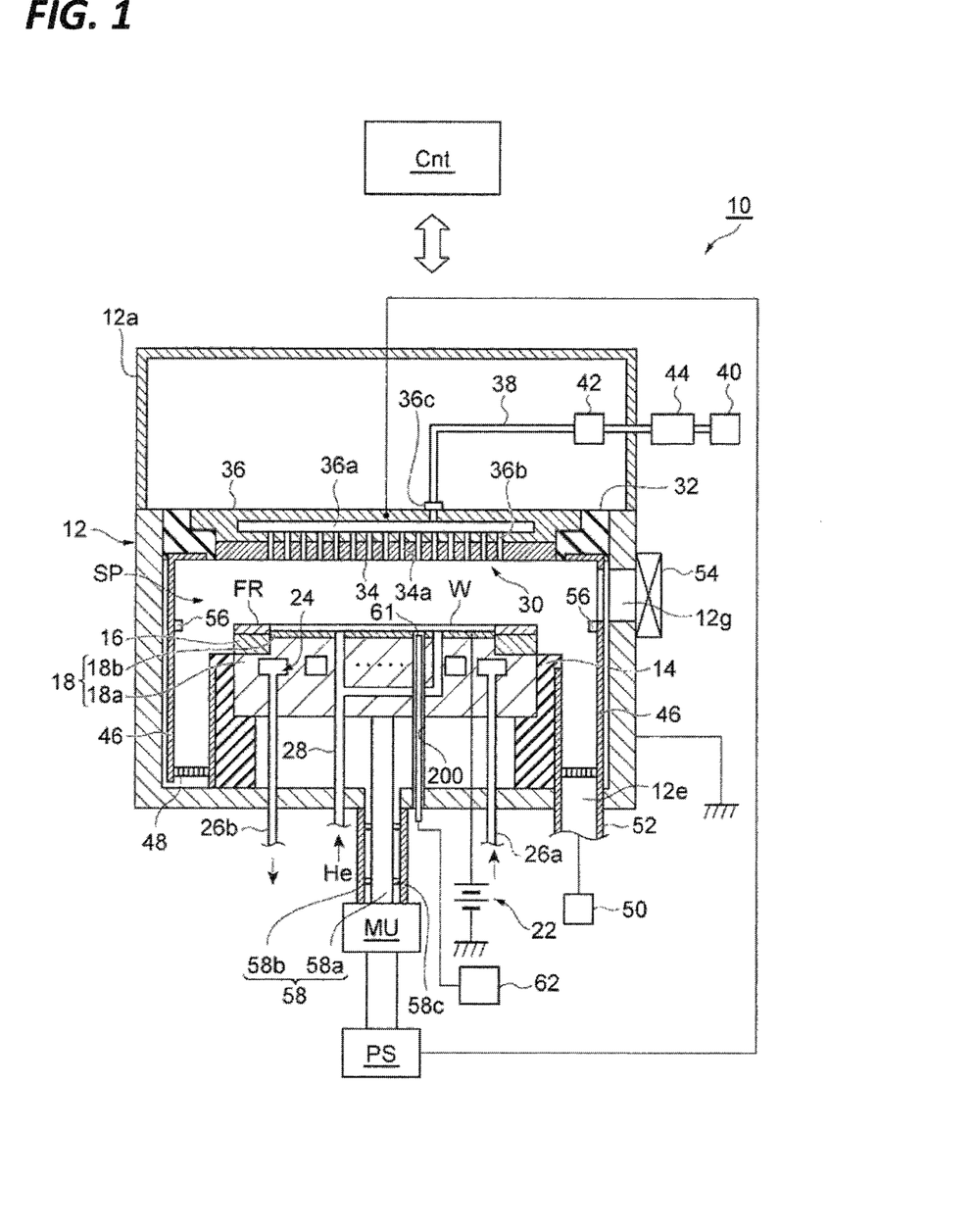
FIG. 1 is a view schematically illustrating a plasma processing apparatus according to an exemplary embodiment.

FIG. 1 is a cross-sectional view schematically illustrating the configuration of a plasma processing apparatus according to an exemplary embodiment. A plasma processing apparatus 10 illustrated in FIG. 1 is a capacitively coupled parallel plate plasma etching apparatus, and includes a substantially cylindrical processing container 12. The inner wall surface of the processing container 12 is made of, for example, anodized aluminum. The processing container 12 is frame-grounded.

A placing table 18 of an exemplary embodiment is provided within the processing container 12. The placing table 18 is supported by a support 14 in an exemplary embodiment. The support 14 is a substantially cylindrical member made of an insulating material, and extends vertically from the bottom portion of the processing container 12. The support 14 may support the placing table 18 by the inner wall surface of the support 14, in the example illustrated in FIG. 1.

The placing table 18 is a table configured to support a wafer W which is a processing target object, and includes a base portion 18a and an electrostatic chuck 18b. The base portion 18a is made of a metal such as, for example, aluminum, and is formed substantially in a disk shape. The base portion 18a is configured as a lower electrode. The electrostatic chuck 18b is provided on the base portion 18a to hold the wafer W. As will be described in more detail below, the electrostatic chuck 18b includes a dielectric substrate, and an electrode provided within the substrate. A DC power supply 22 is electrically connected to an electrode of the electrostatic chuck 18b. The electrostatic chuck 18b may attractively hold the wafer W by an electrostatic force such as, for example, a Coulomb force generated by a DC voltage from the DC power supply 22.

A spacer portion 16 made of an insulator is formed around the base portion 18a of the placing table 18. A focus ring FR is disposed on the spacer portion 16 to surround an edge of the wafer W and the electrostatic chuck 18b. The focus ring FR is provided to improve the uniformity of etching. The focus ring FR is made of a material properly selected according to the material of a film to be etched, and may be made of, for example, quartz.

A flow path 24 for a coolant is formed within the base portion 18a. A coolant at a predetermined temperature is circulated and supplied to the flow path 24 through pipes 26a and 26b from a chiller unit provided at the outside. The coolant is an insulating solution, and may be, for example, a Galden (registered trademark) solution. The temperature of the wafer W supported on the placing table 18 is controlled by controlling the temperature of the coolant which is circulated as described above.

A gas supply line 28 is provided in the plasma processing apparatus 10. The gas supply line 28 supplies a heat transfer gas, for example, He gas, from a heat transfer gas supply mechanism to a gap between the top surface of the electrostatic chuck 18b and the rear surface of the wafer W.

A plurality of lifter pin holes 200 (for example, three holes) is formed in the placing table 18 (only one is illustrated in the drawing), and lifter pins 61 are arranged within the lifter pin holes 200, respectively. The lifter pins 61 are connected to a driving mechanism 62, and vertically moved by the driving mechanism 62.

The plasma processing apparatus 10 further includes an upper electrode 30. The upper electrode 30 is disposed above the placing table 18 to face the placing table 18. The upper electrode 30 and the base portion 18a are formed substantially in parallel to each other. A processing space SP is defined between the upper electrode 30 and the base portion 18a, in which a plasma processing is performed on the wafer W.

The upper electrode 30 is supported on the top of the processing container 12 through an insulating shielding member 32. The upper electrode 30 may include an electrode plate 34 and an electrode support 36. The electrode plate 34 faces the processing space SP, and defines a plurality of gas ejecting holes 34a. The electrode plate 34 may be made of a low resistance conductor generating small Joule heat or a semiconductor.

The electrode support 36 is configured to detachably support the electrode plate 34, and may be made of a conductive material such as, for example, aluminum. The electrode support 36 may have a water cooling structure. A gas diffusion chamber 36a is provided within the electrode support 36. A plurality of gas through holes 36b extends downwardly from the gas diffusion chamber 36a to communicate with the gas ejecting holes 34a. A gas introducing port 36c is formed in the electrode support 36 to introduce a processing gas into the gas diffusion chamber 36a, and a gas supply pipe 38 is connected to the gas introducing port 36c. A gas source group 40 is connected to the gas supply pipe 38 via a valve group 42 and a flow rate controller group 44.

The plasma processing apparatus 10 may further include a ground conductor 12a. The ground conductor 12a is formed in a substantially cylindrical shape, and is provided to extend from the side wall of the processing container 12 to a higher position than the height position of the upper electrode 30.

In the plasma processing apparatus 10, a deposition shield 46 is detachably formed along the inner wall of the processing container 12. The deposition shield 46 is also formed on the outer periphery of the support 14. The deposition shield 46 is configured to suppress etching by-products (deposits) from being attached on the processing container 12, and may be formed by coating a ceramic such as, for example, yttria on an aluminum material.

At the bottom side of the processing container 12, an exhaust plate 48 is provided between the support 14 and the inner wall of the processing container 12. The exhaust plate 48 may be formed by coating a ceramic such as, for example, yttria, on an aluminum material. An exhaust port 12e is formed below the exhaust plate 48 in the processing container 12. An exhaust device 50 is connected to the exhaust port 12e through an exhaust pipe 52. The exhaust device 50 includes a vacuum pump such as, for example, a turbo molecular pump, and may decompress the inside of the processing container 12 to a desired vacuum degree. A carry-in/out port 12g of the wafer W is formed on the side wall of the processing container 12. The carry-in/out port 12g is configured to be capable of being opened/closed by a gate valve 54.

A conductive member (GND block) 56 is provided on the inner wall of the processing container 12. The conductive member 56 is attached on the inner wall of the processing container 12 to be located at substantially the same height as the wafer W in the height direction. The conductive member 56 is DC-connected to ground, and exhibits an abnormal discharge inhibiting effect. The conductive member 56 only has to be provided in a plasma generating region, and its location is not limited to the position illustrated in FIG. 1.

The plasma processing apparatus 10 further includes a power feeding rod 58 configured to supply a high frequency power to the base portion 18a. The power feeding rod 58 has a coaxial double tube structure, and includes a rod-shaped conductive member 58a and a tubular conductive member 58b. The rod-shaped conductive member 58a extends substantially vertically from the outside of the processing container 12 to the inside of the processing container 12 through the bottom of the processing container 12, and the upper end of the rod-shaped conductive member 58a is connected to the base portion 18a. The tubular conductive member 58b is provided coaxially with respect to the rod-shaped conductive member 58a to surround the periphery of the rod-shaped conductive member 58a, and is supported on the bottom of the processing container 12. Two insulating members 58c substantially in a ring shape are interposed between the rod-shaped conductive member 58a and the tubular conductive member 58b to electrically insulate the rod-shaped conductive member 58a and the tubular conductive member 58b from each other.

The plasma processing apparatus 10 may further include a matching unit MU. The matching unit MU is connected to the lower ends of the rod-shaped conductive member 58a and the tubular conductive member 58b. A power system PS is connected to the matching unit MU. The power system PS is also connected to the upper electrode 30. The power system PS is configured to supply two different high frequency powers to the base portion 18a, and to apply a DC voltage to the upper electrode 30.

The plasma processing apparatus 10 may further include a control unit Cnt. The control unit Cnt is a computer provided with, for example, a processor, a storage unit, an input device, and a display device, and controls respective components of the plasma processing apparatus 10, for example, a power supply system, a gas supply system, a driving system, and the power system PS. The control unit Cnt allows an operator to perform, for example, an input operation of a command through the input device in order to manage the plasma processing apparatus 10, and allows the display device to visually display the driving situation of the plasma processing apparatus 10. In the storage unit of the control unit Cnt, a processing recipe is stored. The processing recipe includes a control program which causes respective processings to be executed in the plasma processing apparatus 10 controlled by the processor, or a program which causes respective components of the plasma processing apparatus 10 to execute the processings according to processing conditions.

Figure 2:
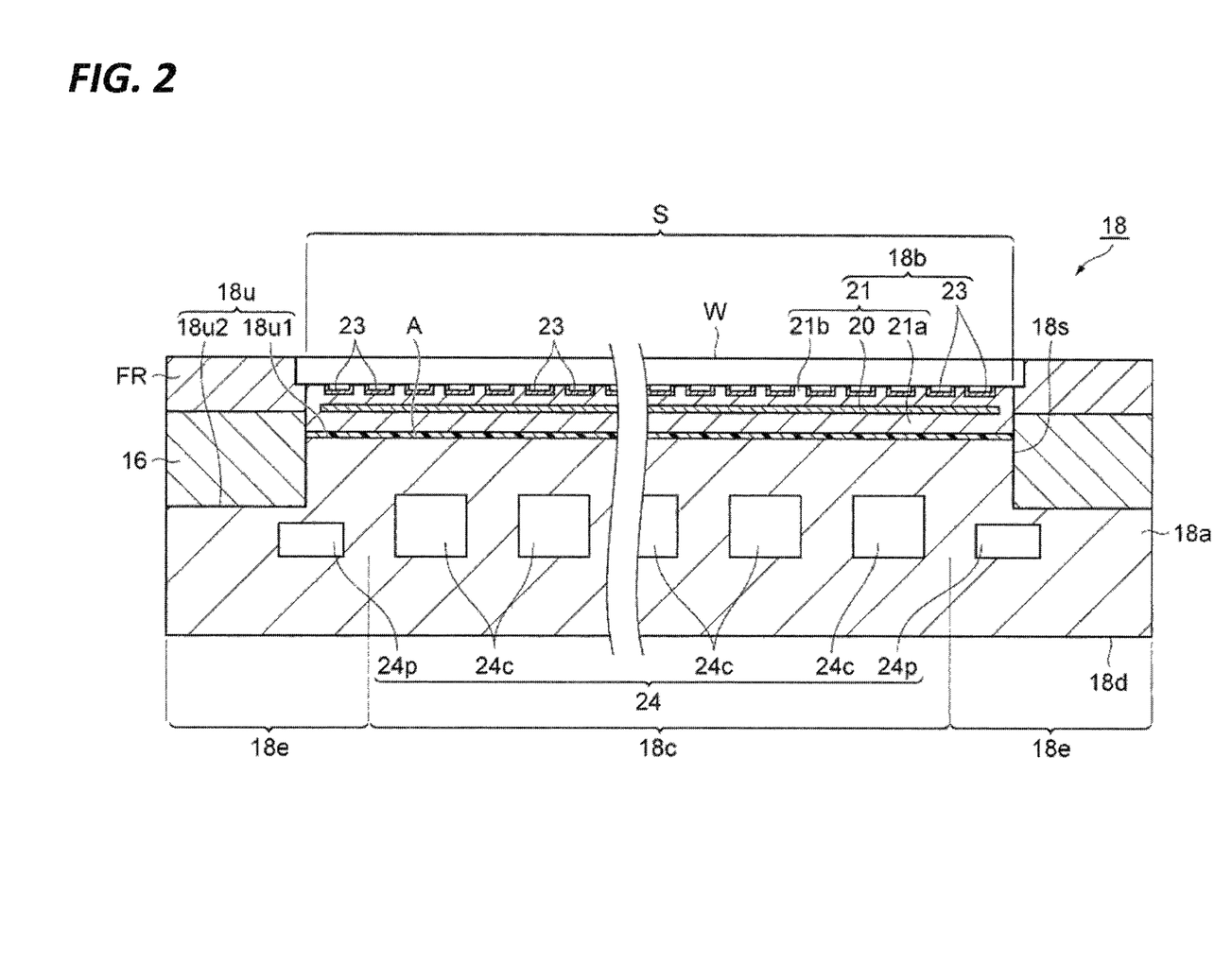
FIG. 2 is a cross-sectional view illustrating a placing table of the plasma processing apparatus illustrated in FIG. 1, and the configuration around the placing table, in an enlarged scale.
Figure 3:
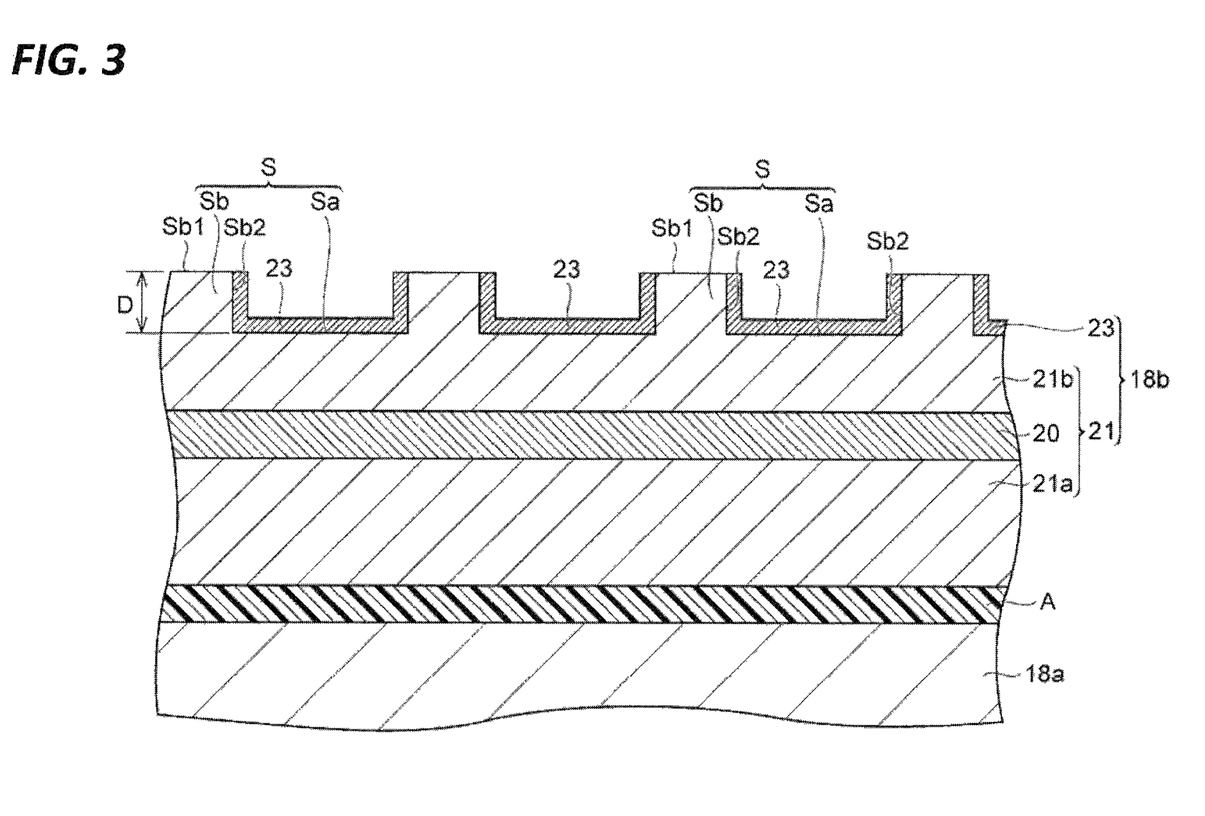
FIG. 3 is a cross-sectional view illustrating a part of FIG. 2 in an enlarged scale.
Figure 4:
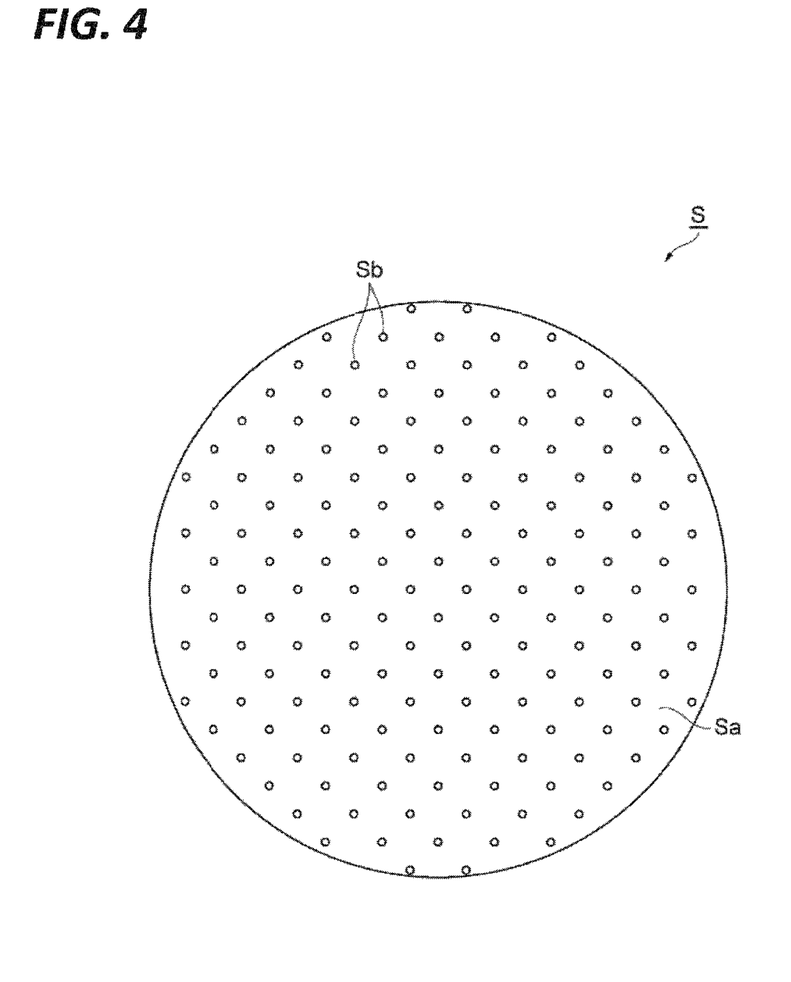
FIG. 4 is a plan view illustrating the surface of an electrostatic chuck illustrated in FIGS. 1 and 2.

Hereinafter, detailed descriptions will be made on a placing table of the plasma processing apparatus 10, an electrostatic chuck of the placing table, and the configuration therearound, with reference to FIGS. 2 to 4 together with FIG. 1. FIG. 2 is a view illustrating the placing table of the plasma processing apparatus illustrated in FIG. 1, and the configuration around the placing table, in an enlarged scale. FIG. 3 is a view illustrating a part of FIG. 2 in an enlarged scale. FIG. 4 is a plan view illustrating the electrostatic chuck illustrated in FIGS. 1 and 2.

In an exemplary embodiment, the base portion 18a includes a bottom face 18d and a top face 18u. The bottom face 18d is a substantially flat surface, and the top face 18u includes a first top face 18u1 and a second top face 18u2. The first top face 18u1 is a circular surface, and is located inside the second top face 18u2. The second top face 18u2 extends annularly to the outside of the first top face. The second top face 18u2 is provided at a lower position than the first top face 18u1. That is, the distance between the second top face 18u2 and the bottom face 18d is shorter than the distance between the first top face 18u1 and the bottom face 18d. The base portion 18a configured as described above further includes an annular side face 18s which substantially vertically extends to connect the first top face 18u1 to the second top face 18u2. On the second top face 18u2 provided at the lower position than the first top face 18u1, the focus ring FR is provided through the spacer portion 16.

The base portion 18a includes a central portion 18c and a peripheral portion 18e. When the first top face 18u1 is divided into a central region and a periphery region, the top surface of the central portion 18c corresponds to a central region of the first top face 18u1. The top surface of the peripheral portion 18e corresponds to a periphery region of the first top face 18u1 and the second top face 18u2. In the base portion 18a, the flow path 24 for a coolant is formed. The flow path 24 includes a central flow path 24c and a periphery flow path 24p. The central flow path 24c is formed within the central portion 18c. The periphery flow path 24p is formed within the peripheral portion 18e.

The electrostatic chuck 18b is provided on the first top face 18u1 of the placing table 18. The first top face 18u1 and the electrostatic chuck 18b are attached to each other through an adhesive layer A. The electrostatic chuck 18b includes a substrate 21 and a protective film 23.

The substrate 21 includes a dielectric layer 21a, a dielectric layer 21b, and an electrode 20 provided between the dielectric layer 21a and the dielectric layer 21b. The dielectric layer 21a and the dielectric layer 21b include, for example, at least one of aluminum oxide, aluminum nitride, quartz (or silicon oxide), silicon nitride, and silicon carbide. In the present exemplary embodiment, the dielectric layer 21a and the dielectric layer 21b may be made of aluminum oxide in view of the change rate of an electrical resistance with respect to temperature, and in view of the hardness, but may be made of aluminum nitride.

As illustrated in FIGS. 3 and 4, the substrate 21 has a surface S. The surface S is a surface opposite to the base portion 18a side. In the plasma processing apparatus 10, the surface S is a surface facing the processing space SP, that is, a plasma generating space. The surface S is constituted by a bottom face Sa, and a plurality of projecting portions Sb protruding from the bottom face Sa. That is, a dot structure constituted by the bottom face Sa, and the plurality of projecting portions Sb is formed on the surface S of the substrate 21. The bottom face Sa is a substantially flat surface. The plurality of projecting portions Sb is formed to protrude from the bottom face Sa. Each of the plurality of projecting portions Sb includes a top face Sb1 to come in contact with a wafer W, and a side face Sb2 extending from the bottom face Sa to the top face Sb1. The top face Sb1 is a substantially flat surface. The shape of the top face Sb1 is not particularly limited, and is may be a substantially circular shape, a substantially rectangular shape, or a substantially polygonal shape.

The distance D between the bottom face Sa and the top face Sb1 in the direction perpendicular to the bottom face Sa ranges from, for example 10 μm to 50 μm. The ratio of the area occupied by the bottom face Sa in the total area of the bottom face Sa and the top faces Sb1 of the plurality of projecting portions Sb ranges from, for example, 60% to 95%. The ratio of the area occupied by the top faces Sb1 in the total area of the bottom face Sa and the top faces Sb1 of the plurality of projecting portions Sb ranges from, for example, 5% to 40%. The top face Sb1 and the side face Sb2 may intersect each other at right angles, or may not intersect each other at right angles. For example, the top face Sb1 and the side face Sb2 may form a cross section in a tapered shape or a curved surface.

The protective film 23 is formed on the bottom face Sa of the substrate 21, and the side faces Sb2 of the plurality of projecting portions Sb. That is, the protective film 23 is formed on the bottom face Sa and the side faces Sb2 such that top faces Sb1 of the plurality of projecting portions Sb are exposed. The protective film 23 is made of yttria in view of plasma resistance. Since the bottom face Sa and the side faces Sb2 of the plurality of projecting portions Sb, which constitute the surface S of the electrostatic chuck 18b, are covered with the protective film 23, occurrence of particles from the substrate 21 is suppressed. Also, since the protective film 23 is not formed on the top faces Sb1 of the projecting portions Sb which are mainly in charge of attraction of the wafer W, it is possible to suppress variation of attraction force due to a temperature change, or due to formation of yttrium fluoride.

In an exemplary embodiment, the protective film 23 may be formed by, for example, a CVD method, an aerosol method, or an ion plating method. The protective film 23 formed by the formation method described above may have a dense film quality. Accordingly, occurrence of particles from the protective film 23 may be suppressed. Also, the film thickness of the protective film 23 may range from 0.5 μm to 10 μm.

In an exemplary embodiment, the ratio of the area occupied by the top faces Sb1 of the plurality of projecting portions Sb in the total area of the bottom face Sa and the top faces Sb1 of the plurality of projecting portions Sb ranges from, for example, 5% to 40%. Since the bottom face Sa and the top faces Sb1 are configured in the area ratio described above, occurrence of particles from the substrate 21 may be further suppressed. Also, it is possible to further suppress variation of attraction force due to a temperature change or change of attraction force due to change of yttria for the protective film 23 into yttrium fluoride.

Hereinafter, detailed descriptions will be made on an example of a method of manufacturing an electrostatic chuck provided on a placing table with reference to FIGS. 5A to 5D, FIGS. 6A to 6C, and FIG. 7. FIGS. 5A to 5D, FIGS. 6A to 6C, and FIG. 7 are drawings illustrating a method of manufacturing the electrostatic chuck according to the present exemplary embodiment, respectively.

Figure 5A:
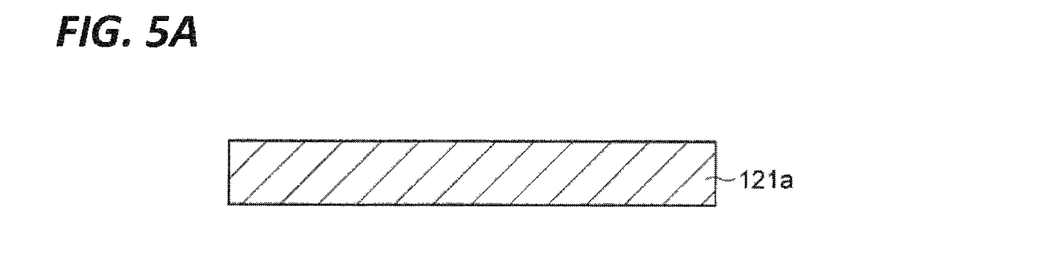
FIGS. 5A to 5D are views illustrating a manufacturing method of an electrostatic chuck according to an exemplary embodiment.

First, as illustrated in FIG. 5A, an unsintered dielectric layer 121a is prepared. The unsintered dielectric layer 121a is an insulating dielectric layer including, for example, aluminum oxide or aluminum nitride. The unsintered dielectric layer 121a may be prepared on any type of base.

Figure 5B:
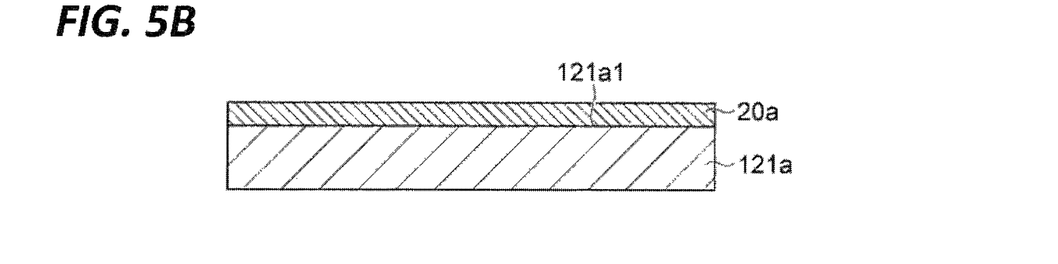

Then, as illustrated in FIG. 5B, a layered conductive paste 20a is disposed on a main surface 121a1 of the unsintered dielectric layer 121a. The conductive paste 20a is disposed on the unsintered dielectric layer 121a through, for example, various coating methods or printing methods. The conductive paste 20a is made of for example, a resin including metallic particles (e.g., gold (Au) or silver (Ag)).

Figure 5C:
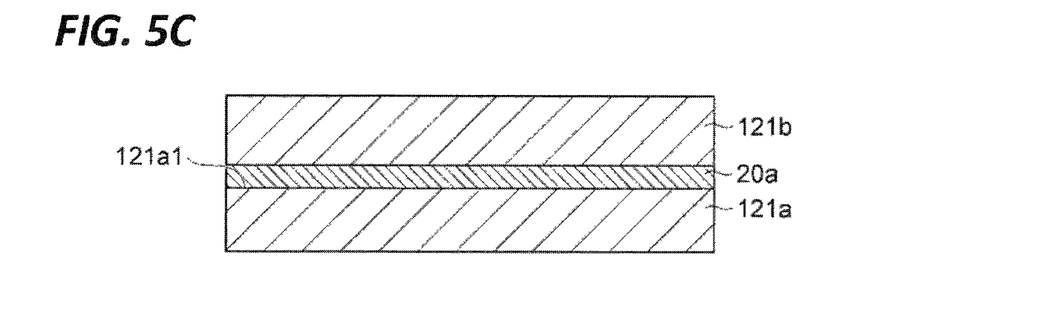

Then, as illustrated in FIG. 5C, an unsintered dielectric layer 121b is formed on the main surface 121a1 of the unsintered dielectric layer 121a, and the conductive paste 20a. That is, the unsintered dielectric layer 121b is formed such that the conductive paste 20a is interposed between the unsintered dielectric layer 121a and the unsintered dielectric layer 121b. The unsintered dielectric layer 121b is the same dielectric layer as the unsintered dielectric layer 121a.

Figure 5D:
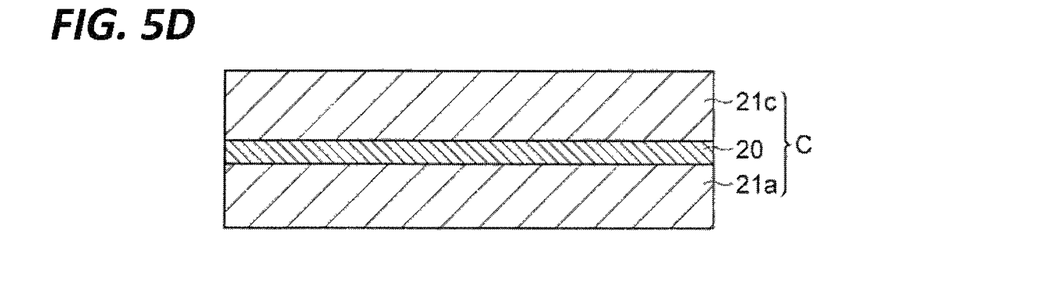

Then, as illustrated in FIG. 5D, the unsintered dielectric layer 121a, the unsintered dielectric layer 121b, and the conductive paste 20a are sintered. Accordingly, a sintered body C including the dielectric layer 21a, the electrode 20, and the dielectric layer 21c is formed. For example, a laminate of the unsintered dielectric layer 121a, the unsintered dielectric layer 121b, and the conductive paste 20a is heated in an electric furnace to prepare the sintered body C.

Figure 6A:
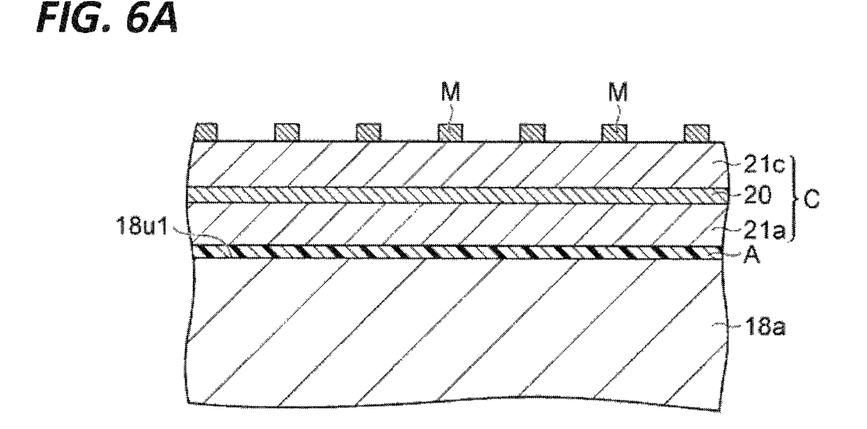
FIGS. 6A to 6C are views illustrating a manufacturing method of an electrostatic chuck according to an exemplary embodiment.

Then, as illustrated in FIG. 6A, the sintered body C is bonded to the first top face 18a1 of the base portion 18a through the adhesive layer A. Also, a patterned resist mask M is formed on the dielectric layer 21c. The resist mask M is formed by, for example, photolithography.

Figure 6B:
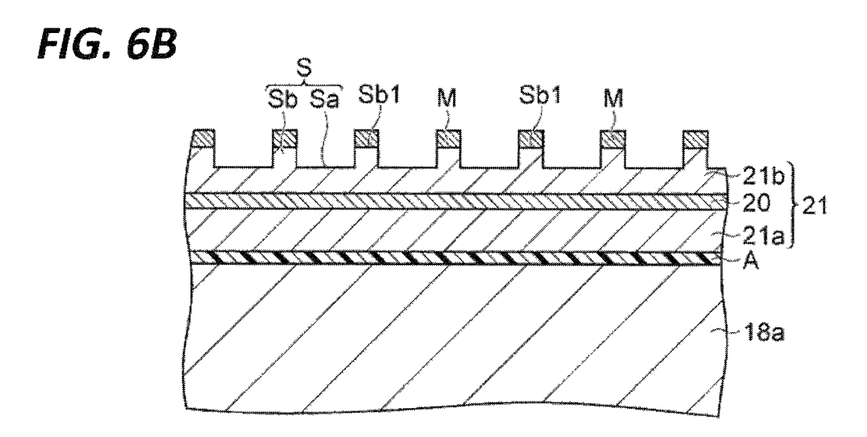

Then, as illustrated in FIG. 6B, the sintered body C is subjected to a blast treatment to prepare the substrate 21 with the dot structure. Specifically, the surface formed with the resist mask M in the sintered body C is subjected to the blast treatment. Through the blast treatment, the substrate 21 (the dielectric layer 21b) which has the surface S including the bottom face Sa, and the plurality of projecting portions Sb protruding from the bottom face Sa is prepared. As for the blast treatment, a conventionally known technology may be used.

Figure 6C:
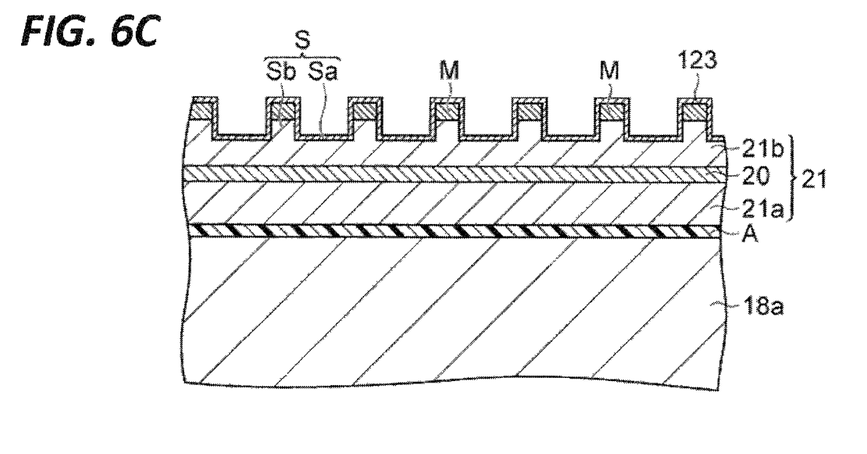

Then, as illustrated in FIG. 6C, a protective film 123 is formed on the surface S of the substrate 21 and the resist mask M. The protective film 123 made of yttria is formed by, for example, a CVD method, an aerosol method or an ion plating method. In the present exemplary embodiment, in terms of forming a film with a dense film quality, a CVD method is used.

Figure 7:
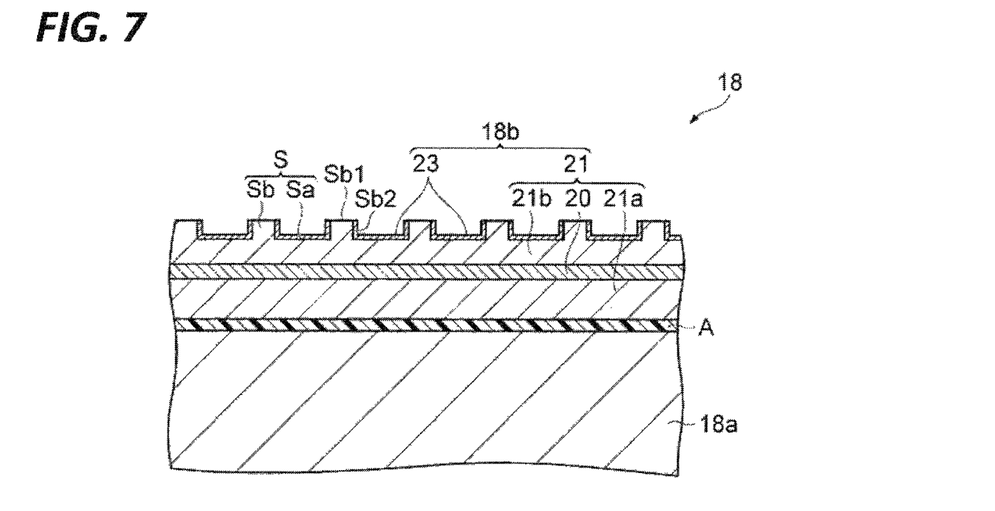
FIG. 7 is a view illustrating a manufacturing method of an electrostatic chuck according to an exemplary embodiment.

Then, as illustrated in FIG. 7, the resist mask M is removed from the substrate 21. Accordingly, the protective film 123 formed on the resist mask M is removed. That is, the protective film 23 is formed on the side faces Sb2 of the plurality of projecting portions Sb and on the bottom face Sa such that the top faces Sb1 are exposed on the surface S of the substrate 21. As described above, the electrostatic chuck 18b provided with the substrate 21 and the protective film 23 is manufactured.

Through the manufacturing method described above, the electrostatic chuck 18b may be manufactured. In an exemplary embodiment, the protective film 23 may be formed by a CVD method, an aerosol method or an ion plating method. The protective film 23 formed by these formation methods may have a dense film quality. Accordingly, occurrence of particles from the protective film 23 may be suppressed.

Figure 8:
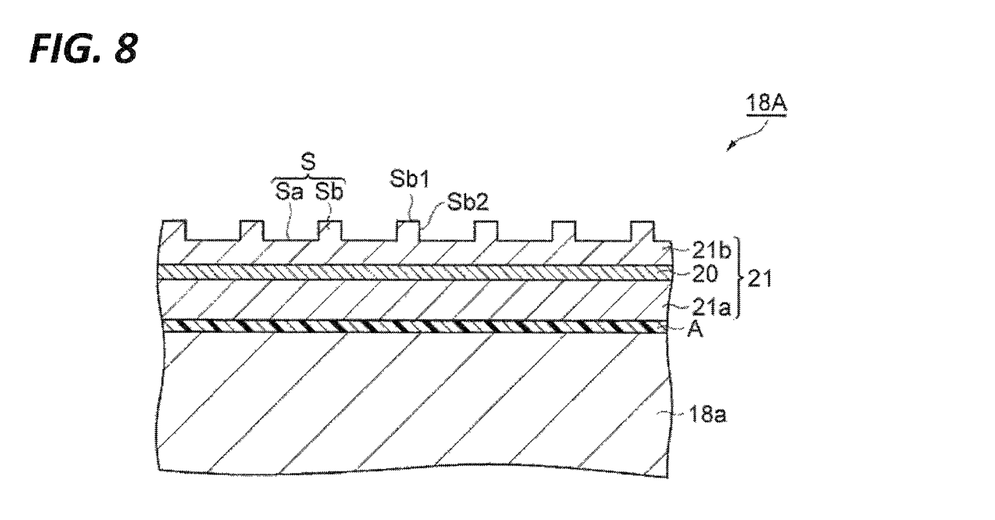
FIG. 8 is a cross-sectional view illustrating the configuration of a part of a placing table according to a first reference example.
Figure 9:
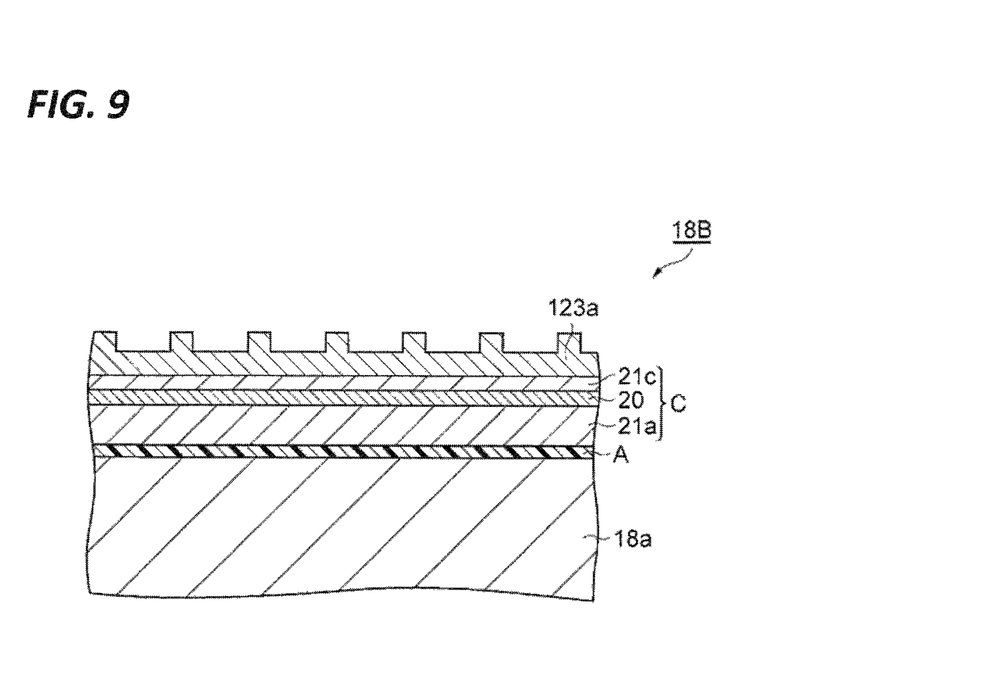
FIG. 9 is a cross-sectional view illustrating the configuration of a part of a placing table according to a second reference example.

Hereinafter, with reference to FIGS. 3, 8 and 9, descriptions will be made on a result of comparison of a placing table provided with an electrostatic chuck according to the present exemplary embodiment, to a placing table provided with an electrostatic chuck according to reference examples. FIG. 8 is a cross-sectional view illustrating a configuration of a part of a placing table according to a first reference example. FIG. 9 is a cross-sectional view illustrating a configuration of a part of a placing table according to a second reference example.

As illustrated in FIG. 8, a placing table 18A according to the first reference example does not include the protective film 23 unlike the placing table 18 according to the present exemplary embodiment as illustrated in FIG. 3. That is, in the substrate 21 of the first reference example, the surface S including the bottom face Sa and the plurality of projecting portions Sb, in its entirety, is exposed. In this case, the bottom face Sa, and the top faces Sb1 and the side faces Sb2 of the plurality of projecting portions Sb become fractured surfaces from which particles are likely to occur. That is, the surface S may be a cause of particles. Also, when the substrate 21 is made of, for example, aluminum oxide or aluminum nitride, Al (aluminum) contamination of the wafer W may be likely to occur.

In contrast, in the placing table 18 according to the present exemplary embodiment, the bottom face Sa of the substrate 21 and the side faces Sb2 of the plurality of projecting portions Sb are covered with the protective film 23. That is, a part of fractured surfaces is covered with the protective film 23. Therefore, in the placing table 18 according to the present exemplary embodiment, particles occurring from the substrate 21 are reduced as compared to in the placing table 18A according to the first reference example. As the ratio of the area occupied by the top faces Sb1 of the plurality of projecting portions Sb in the total area of the bottom face Sa on the surface S and the top faces Sb1 of the plurality of projecting portions Sb is decreased, particles occurring from the substrate 21 are reduced.

Also, as illustrated in FIG. 9, a placing table 18B according to a second reference example includes a protective film 123a with a dot structure which is formed on the dielectric layer 21c, unlike the placing table 18 according to the present exemplary embodiment as illustrated in FIG. 3. The protective film 123a is formed by spraying yttria. The protective film 123a comes in contact with the wafer W in the placing table 18B. Accordingly, Al (aluminum) contamination of the wafer W may not occur. However, the protective film 123a formed by spraying may have a lower hardness than the sintered body C. In this case, a large amount of particles may occur from the protective film 123a due to, for example, friction with the wafer W. Also, yttria has a large change rate of electrical resistance with respect to temperature. Further, when the wafer W is processed by plasma of a fluorine-containing gas, yttrium fluoride is formed on the surface of the protective film 123a by a reaction between yttria and active species of fluorine. Accordingly, an attraction force of the placing table 18B may be varied during the plasma processing, and may be changed according to formation of yttrium fluoride.

In contrast, in the placing table 18 according to the present exemplary embodiment, the top faces Sb1 of the plurality of projecting portions Sb to come in contact with the wafer W are exposed from the protective film 23. That is, since the protective film 23 is not formed on the top faces Sb1 of the projecting portions Sb which are mainly in charge of attraction of the wafer W, it is possible to suppress an attraction force from being varied, or an attraction force from being changed according to formation of yttrium fluoride. Also, since the top faces Sb1 of the projecting portions Sb come in contact with the wafer W, particles are suppressed from occurring.

As described above, various exemplary embodiments have been described, but various modified embodiments may be configured without being limited to the above described exemplary embodiments. For example, the electrostatic chuck 18b and the placing table 18 may be used for other processing apparatuses (for example, a vacuum deposition apparatus) besides the plasma processing apparatus 10.

The plasma processing apparatus 10 is a capacitively coupled plasma processing apparatus, but the electrostatic chuck and the placing table in the above described exemplary embodiments may be used for a plasma processing apparatus having any type of plasma source. For example, the electrostatic chuck and the placing table in the above described exemplary embodiments may be used for, for example, an inductively coupled plasma processing apparatus, or a plasma processing apparatus using surface waves such as microwaves, as a plasma source.

The protective film 23 is a material having a plasma resistance, and may be made of a material which does not contain an element causing contamination on a processing target object. Further, in the process of preparing the sintered body C, the sequence or the number of sintering processes are not limited. For example, after the dielectric layer 21a is formed by sintering the unsintered dielectric layer 121a, the conductive paste 20a may be formed.

In the above described exemplary embodiments, the top faces Sb1 of the plurality of projecting portions Sb, which are exposed from the protective film 23, are formed using the resist mask M. However, the method of forming the plurality of projecting portions Sb and the top faces Sb1 exposed from the protective film 23 is not limited thereto.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of manufacturing an electrostatic chuck, the method comprising:
   providing a dielectric substrate having a surface which is constituted by a bottom face, and a plurality of projecting portions protruding from the bottom face, the plurality of projecting portions including top faces to come in contact with the processing target object, and side faces extending from the bottom face to the top faces, respectively; and
   forming a protective film made of yttrium oxide on the side faces of the plurality of projecting portions and the bottom face of the substrate excluding the top faces of the plurality of projecting portions.

2. The method of claim 1, the preparing of the substrate further includes:
   providing a first unsintered dielectric layer;
   disposing a conductive paste on a main surface of the first unsintered dielectric layer;
   forming a second unsintered dielectric layer on the conductive paste and the first unsintered dielectric layer;
   sintering the first unsintered dielectric layer, the second unsintered dielectric layer, and the conductive paste to prepare a sintered body; and
   forming the bottom face and the plurality of projecting portions on the sintered body.

3. The method of claim 1, wherein the substrate includes aluminum oxide or aluminum nitride.

4. The method of claim 1, wherein the protective film has a film thickness ranging from 0.5 μm to 10 μm.

5. The method of claim 1, wherein a ratio of an area occupied by the top faces of the plurality of projecting portions in a total area of the bottom face and the top faces of the plurality of projecting portions ranges from 5% to 40%.

6. The method of claim 1, wherein the protective film is formed by a CVD method, an aerosol method or an ion plating method.

7. The method of claim 1, further comprising:
   forming a patterned mask corresponding to the plurality of projecting portions on a surface of the substrate in a state before the bottom surface of the substrate and the plurality of projecting portions are formed, and
   wherein the forming of the protective film includes:
      forming the protective film on the side faces of the plurality of projecting portions, the bottom surface of the substrate, and the patterned mask; and
      removing the patterned mask and a protective film formed on the patterned mask.

* * * * *